(12) United States Patent
Takyu et al.

(10) Patent No.: US 7,060,532 B2
(45) Date of Patent: *Jun. 13, 2006

(54) MANUFACTURING METHOD OF SEMICONDUCTOR DEVICE

(75) Inventors: Shinya Takyu, Saitama (JP); Tetsuya Kurosawa, Kanagawa (JP); Kinya Mochida, Saitama (JP); Kenichi Watanabe, Saitama (JP)

(73) Assignees: Kabushiki Kaisha Toshiba, Tokyo (JP); Lintec Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/815,934

(22) Filed: Apr. 2, 2004

(65) Prior Publication Data

US 2005/0003636 A1    Jan. 6, 2005

(30) Foreign Application Priority Data

Apr. 3, 2003    (JP)    ............................. 2003-100413

(51) Int. Cl.
*H01L 21/44*    (2006.01)
(52) U.S. Cl. ...................................... 438/114; 438/126
(58) Field of Classification Search ........ 438/106–127, 438/612–617; 257/667–671, 687, 701, 702
See application file for complete search history.

(56) References Cited

U.S. PATENT DOCUMENTS

| 4,556,362 | A  | 12/1985 | Bahnck et al. |
| 4,667,944 | A  | 5/1987  | Althouse |
| 4,778,326 | A  | 10/1988 | Althouse et al. |
| 6,209,532 | B1 | 4/2001  | Arnold et al. |
| 6,220,771 | B1 | 4/2001  | Tung et al. |
| 6,465,330 | B1 | 10/2002 | Takahashi et al. |

FOREIGN PATENT DOCUMENTS

EP    0 981 156 A2    2/2000

(Continued)

OTHER PUBLICATIONS

European Search Report in Application No. 04008108, dated Aug. 5, 2004.

(Continued)

*Primary Examiner*—Brook Kebede
(74) *Attorney, Agent, or Firm*—Finnegan, Henderson, Farabow, Garrett & Dunner, L.L.P.

(57) ABSTRACT

A manufacturing method of a semiconductor device includes: providing a groove having a thickness equal to or larger than a finishing thickness on a first surface of a semiconductor wafer on which a semiconductor element is formed; affixing a PSA tape onto the first surface of the semiconductor wafer in which the groove is formed; reducing the thickness of the semiconductor wafer by processing a second surface opposite to the first surface of the semiconductor wafer onto which the PSA tape is affixed, so as to separate the semiconductor wafer into a plurality of semiconductor chips on which the semiconductor element is formed; affixing an adhesive layer onto an entire rear surface of the separated semiconductor wafer; cutting the adhesive layer so as to separate the adhesive layer for each of the semiconductor chips; and peeling off the PSA tape from the semiconductor wafer while fixing the semiconductor wafer under suction by use of a porous member segmented into at least two sucking areas.

4 Claims, 17 Drawing Sheets

FOREIGN PATENT DOCUMENTS

| | | |
|---|---:|---:|
| EP | 1107299 A2 * | 6/2001 |
| JP | 2000-091281 | 3/2000 |
| JP | 2000195878 A * | 7/2000 |
| JP | 2000-315697 | 11/2000 |
| JP | 2003-017513 | 1/2003 |
| JP | 2003-179126 | 6/2003 |
| KR | 2000-0017349 | 3/2000 |
| TW | 463254 | 11/2001 |

OTHER PUBLICATIONS

Office Action issued by the Taiwanese Patent Office on Mar. 14, 2006, for Taiwanese Patent Application No. 93109271, and English-language translation thereof..

Notification of Submission of Argument issued by the Korean Patent Office on Mar. 9, 2006, for Korean Patent Application No. 23043/2004/10, and English-language translation thereof.

* cited by examiner

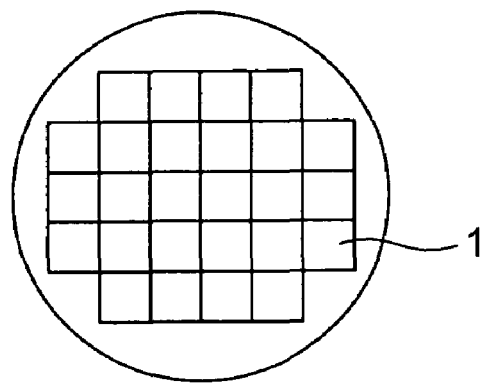
FIG.10A
FIG.10B
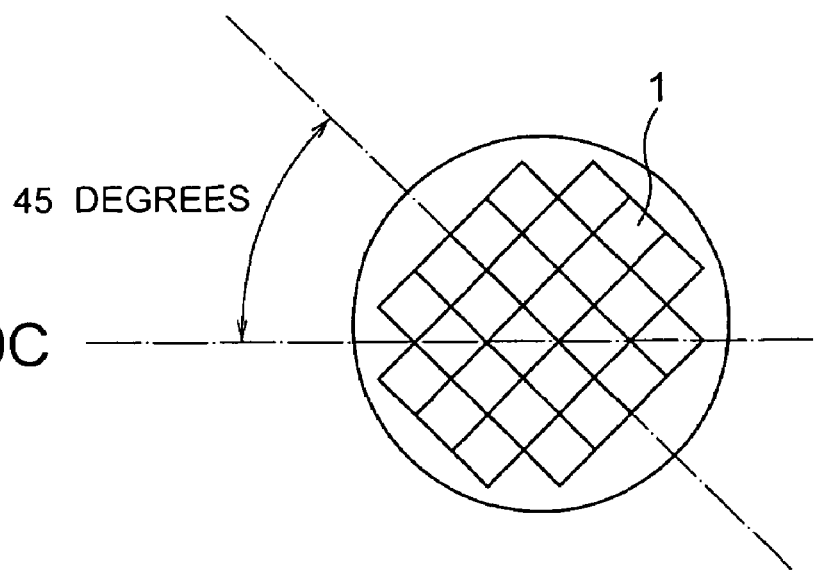
FIG.10C

AFTER TCT

AFTER TCT

MANUFACTURING METHOD OF SEMICONDUCTOR DEVICE

CROSS REFERENCE TO RELATED APPLICATION

This application claims benefit of priority under 35USC §119 to Japanese Patent Application No. 2003-100413, filed on Apr. 3, 2003, the contents of which are incorporated by reference herein.

BACKGROUND OF THE INVENTION

1. Field of the Invention

The present invention relates to a manufacturing method of a semiconductor device, and for example, relates to a manufacturing method of a semiconductor device including a process for peeling a pressure sensitive adhesive tape, which has been affixed during a manufacturing process, from semiconductor chips which constitute a stacked MCP (Multi-Chip Package) type semiconductor device and in which an adhesive layer is formed on a rear surface.

2. Related Background Art

Generally in a manufacturing process of a semiconductor device, a semiconductor wafer which has finished with element formation is separated along a dicing line or a chip division line, and broken to be separated into a plurality of semiconductor chips. A pressure sensitive adhesive tape (which will hereinafter be referred to a PSA tape) is affixed to the semiconductor wafer before and after the separation process, and the semiconductor chips in the piece form are integrated to keep a wafer shape. The semiconductor wafer, which has thus been broken into a plurality of semiconductor chips and is supported by the PSA tape, is transferred to a mounting process using a die bonder or the like. Each semiconductor chip separated from the semiconductor wafer is picked up from the PSA tape, and brought to a mounting process such as a process of mounting to a leadframe and a TAB tape or a process of sealing into a package, thereby completing the semiconductor device.

In picking up such individual semiconductor chips the rear surface of the semiconductor wafer, opposite to a surface to which the PSA tape is affixed, is affixed to another PSA tape which is affixed to a wafer ring, and then the PSA tape is peeled off, and the wafer ring is mounted to a pickup device to pick up the individual semiconductor chips.

FIG. 23 is an enlarged sectional view of essential components of a conventional pickup device disclosed in Japanese Patent Publication Laid-open No. 2003-17513 (see FIG. 1, FIG. 2, and parts where explanation is given in connection with these drawings), and it shows an operation for picking up a semiconductor chip 100 from a PSA tape 101.

When the semiconductor chip 100 is peeled off and picked up from the PSA tape 101 affixed to the wafer ring, raising pins (needles) 102 are projected (lifted) via the PSA tape 101 from a rear surface side of the semiconductor chip 100, and elasticity of the PSA tape 101 is utilized to peel off the semiconductor chip 100. The raising pins 102 are disposed at corner portions or positions corresponding to the vicinity of a central portion of the semiconductor chip 100, and their base portions are attached to a pin holder 103.

As an order to peel off the semiconductor chip 100 from the PSA tape 101, a holding table, on which the PSA tape 101 to which the semiconductor chip 100 is affixed is fixed, is first moved so that the semiconductor chip 100 to be picked up will be located above the raising pins 102. Next, for example, detection of a position of the semiconductor chip 100 to be peeled off and mark detection for identification of non-defective/defective products are performed, and an internal portion of a backup holder 104 is attracted by vacuum to cause the PSA tape 101 to be sucked and fixed onto an upper surface of the backup holder 104. In this state, the pin holder 103 to which the raising pins 102 are mounted is lifted to project the raising pins 102 from the upper surface of the backup holder 104 and raise the semiconductor chip 100 via the PSA tape 101 from the rear surface side. The raised semiconductor chip 100 is sucked by a suction collet 105 and supplied to the mounting process.

There has recently been a keen desire for a thinner semiconductor chip, for example, to have the semiconductor chip built in a thin card-shape package, and the thickness of the semiconductor chip is reduced to 100 μm or less by further polishing, grinding and etching a rear surface of the semiconductor wafer.

Problems with the cracks when the thickness of the semiconductor chip is thus reduced to 100 μm or less will be described in greater detail referring to FIGS. 24A to 25B.

With the thickness of the semiconductor chip being very small as described above, even if an outer peripheral portion (corner portions in particular) of the semiconductor chip 100 comes off, the semiconductor chip 100 warps in a concave shape before being peeled off as shown in FIG. 24A because a speed at which the PSA tape 101 is peeled off is slower than a speed at which the raising pins 102 are lifted, and is finally cracked as shown in FIG. 24B. Further, as shown in FIG. 25A, if the rear surface side of the semiconductor chip 100 is raised with the raising pins 102 via the PSA tape 101, cracks are caused in portions of the semiconductor chip 100 that contact the raising pins 102 with only the corner portions being peeled off, or the raising pins 102 penetrate, leading to a crack of the chip as shown in FIG. 25B. If the thickness of the semiconductor chip is 100 μm or more, such a phenomenon is less likely to occur since strength (thickness direction) of the semiconductor chip is higher than a force of adhesion to the semiconductor chip 100 of the PSA tape 101.

A conventional manufacturing method of the semiconductor device described above is also applied to a stacked MCP type semiconductor device. In the conventional manufacturing method of stacked MCP type products, semiconductor chips are produced in processes of grinding the rear surface, affixing a film-like adhesive (adhesive layer) onto the rear surface, and dicing, and the plurality of semiconductor chips is stacked on multiple stages by repeating die bonding and bonding, and then molded.

FIGS. 26 to 31 are process sectional views explaining a conventional manufacturing process of the stacked MCP product up to the production of the semiconductor chips. First, a PSA tape (surface protection tape) 24 is affixed to an element formation surface MS of a semiconductor wafer W100 on which a semiconductor element is formed (FIG. 26). The thickness of the semiconductor wafer W100 is then reduced by rear surface grinding (FIG. 27). Further, an adhesive layer 109 for stacking the semiconductor chips is affixed to the rear surface (FIG. 28). Next, the rear surface of the semiconductor wafer W100, opposite to element formation surface MS to which the PSA tape 24 is affixed, is affixed to another PSA tape 112 which is affixed to a wafer ring 102 (FIG. 29). Subsequently, the PSA tape 24 is peeled off (FIG. 30). Next, a semiconductor wafer W100 is separated and cut together with the adhesive layer 109 into semiconductor chips 1 by a laser, a blade or the like (FIG. 31).

The conventional manufacturing method of the semiconductor device described above is also applied to a stacked MCP type semiconductor device. In the conventional manufacturing method of the stacked MCP products, the semiconductor chips are produced in the processes of grinding the rear surface, affixing the film-like adhesive (adhesive layer) onto the rear surface, and dicing, and the plurality of semiconductor chips are stacked on multiple stages by repeating die bonding and bonding, and then molded. This method has the following problems.

(Problem 1) Because the semiconductor chips are produced in the processes of grinding the rear surface, affixing the film-like adhesive and dicing, the rear surface is frequently chipped, so that only the chips with low deflecting strength can be produced. As a result, only the semiconductor chips having a thickness of 100 to 150 µm could be produced.

(Problem 2) Because the rear surface is frequently chipped in the semiconductor chip as described above, the semiconductor chip might be cracked in bonding it.

(Problem 3) A method is conceivable as means to solve the problems described above in which an etching process is performed after the rear surface grinding to enhance the deflecting strength of the chip. However, in this method, the rear surface is more largely chipped than in the method of rear surface grinding followed by dicing without etching if the thickness of the chip is less than 100 µm, and this rather increases plastic defects.

(Problem 4) Even if the problems described above can be solved and the semiconductor chip having thickness less than 100 µm is successfully produced the problems that have been explained referring to FIGS. 24A to 25B still occur.

As described above, if the thickness of the semiconductor chip is reduced, the deflecting strength of the semiconductor chip is decreased. Moreover, quality deterioration such as the cracks and chipping, and a lowering yield ratio can not be avoided with a conventional mechanism and method for peeling the PSA tape and a conventional device and method for picking up the semiconductor chip. Therefore, improvement has been desired in the manufacturing method of the semiconductor device comprising the above. Especially, when the adhesive, and an adhesive layer such as an adhesive sheet or an adhesive film adhere to the rear surface of the semiconductor chip, load is higher during peeling off and fracture is more frequently caused, resulting in a problem of the quality deterioration and lowering yield ratio in the semiconductor device.

BRIEF SUMMARY OF THE INVENTION

According to a first aspect of the present invention, there is provided a manufacturing method of a semiconductor device, comprising:

providing a groove having a thickness equal to or larger than a finishing thickness on a first surface of a semiconductor wafer on which a semiconductor element is formed;

affixing a pressure sensitive adhesive (PSA) tape onto the first surface of the semiconductor wafer in which the groove is formed;

reducing the thickness of the semiconductor wafer by processing a second surface opposite to the first surface of the semiconductor wafer onto which the PSA tape is affixed, so as to separate the semiconductor wafer into a plurality of semiconductor chips on which the semiconductor element is formed;

affixing an adhesive layer onto an entire rear surface of the separated semiconductor wafer;

cutting the adhesive layer so as to separate the adhesive layer for each of the semiconductor chips; and peeling off the PSA tape from the semiconductor wafer while fixing the semiconductor wafer under suction by use of a porous member segmented into at least two sucking areas.

According to a second aspect of the present invention, there is provided a manufacturing method of a semiconductor device, comprising:

providing a groove having a thickness equal to or larger than a finishing thickness on a first surface of a semiconductor wafer on which a semiconductor element is formed;

affixing a pressure sensitive adhesive (PSA) tape onto the first surface of the semiconductor wafer in which the groove is formed;

reducing the thickness of the semiconductor wafer by processing a second surface opposite to the first surface of the semiconductor wafer onto which the PSA tape is affixed, so as to separate the semiconductor wafer into a plurality of semiconductor chips on which the semiconductor element is formed;

affixing an adhesive layer onto an entire rear surface of the separated semiconductor wafer;

peeling off the PSA tape from the semiconductor wafer while fixing the semiconductor wafer, to which the adhesive layer is affixed, under suction by use of a porous member segmented into at least two sucking areas; and cutting the adhesive layer affixed onto the entire second surface so as to separate the adhesive layer for each of the semiconductor chips, while fixing the semiconductor wafer, from which the PSA tape has been peeled off, onto the porous member under suction.

BRIEF DESCRIPTION OF THE DRAWINGS

In the accompanying drawings:

FIGS. 10A to 10C are plan views explaining a positional relationship between the wafer sucking section shown in FIG. 8 and the semiconductor wafer broken to be separated into chips;

DETAILED DESCRIPTION OF THE INVENTION

Embodiments of the invention will hereinafter be described in reference to the drawings.

First, a first embodiment will be described referring to FIG. 1 to FIG. 14C.

FIGS. 1 to 7 are process sectional views explaining a process in which a semiconductor element is formed on a semiconductor wafer, and then the semiconductor wafer is broken into semiconductor chips, and a PSA tape affixed to the semiconductor wafer is peeled off.

Figure 1:
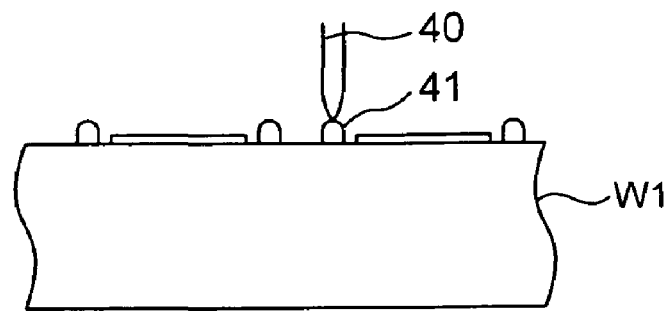
FIGS. 1 to 7 are process sectional views explaining a process in which a semiconductor element is formed on a semiconductor wafer, and then the semiconductor wafer is broken into semiconductor chips, and a PSA tape affixed to the semiconductor wafer is peeled off according to a first embodiment of the present invention.
Figure 2:
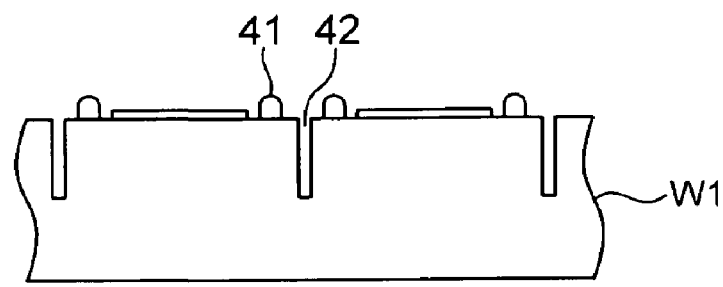
Figure 3:
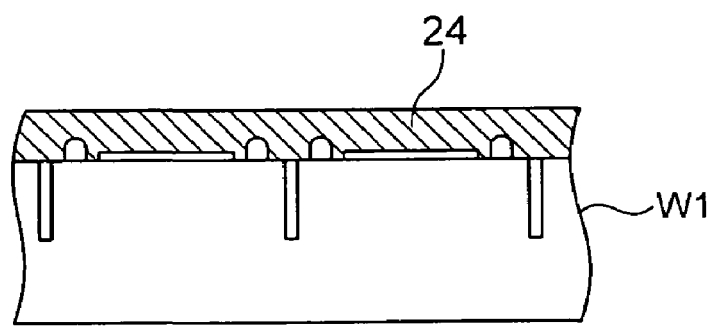
Figure 4:
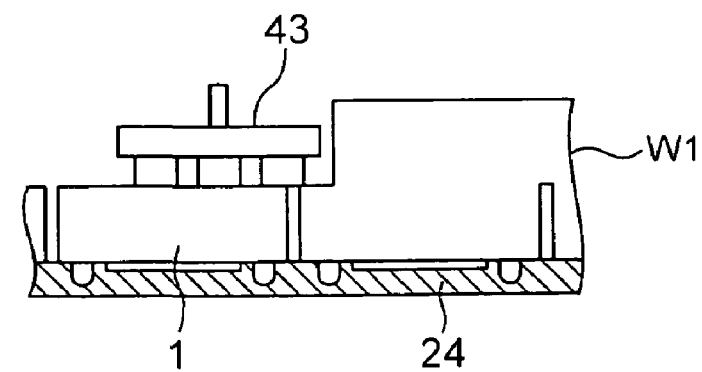

On an element formation surface of a semiconductor wafer W1 made of silicon or the like, the semiconductor element is formed, and a bump 41 electrically connected to the semiconductor element is further formed by use of a capillary 40 (FIG. 1). Next, a cut groove 42 having a depth that does not reach a rear surface is formed from an element formation surface side of the semiconductor wafer W1 along a dicing line or a chip division line by use of a diamond scriber, a diamond blade or a laser scriber. Formation of this cut groove is called half cut dicing (FIG. 2). Next, a PSA tape 24 as a surface protection tape is affixed to the element formation surface of the semiconductor wafer W1 (FIG. 3). Then, the rear surface of the semiconductor wafer W1 is ground with a grind stone 43 so as to reduce the thickness of the semiconductor wafer W1 until the semiconductor wafer W1 is divided into individual semiconductor chips 1 (dicing before grinding) (FIG. 4).

Figure 5:
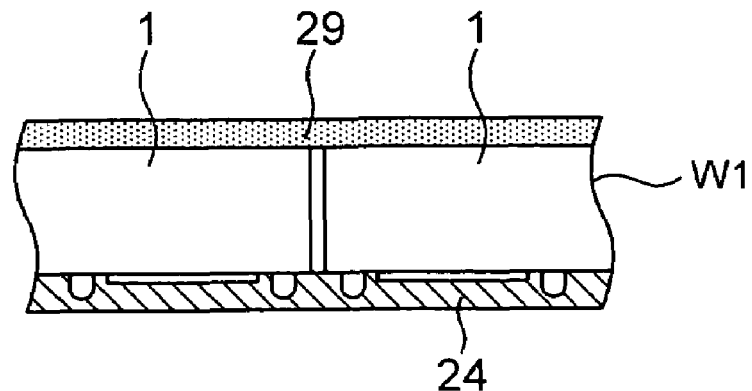
Figure 6:
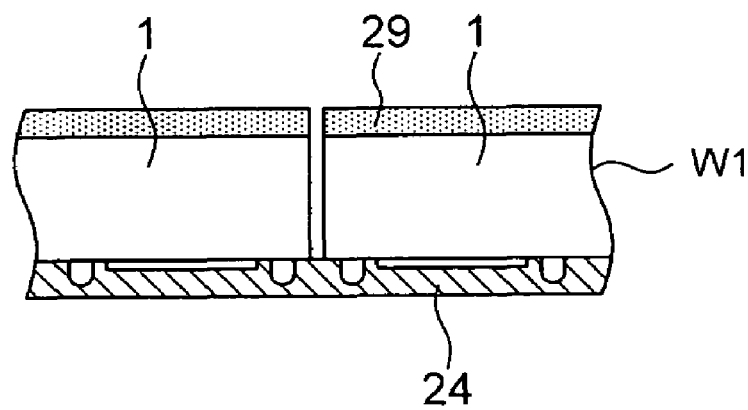
Figure 7:
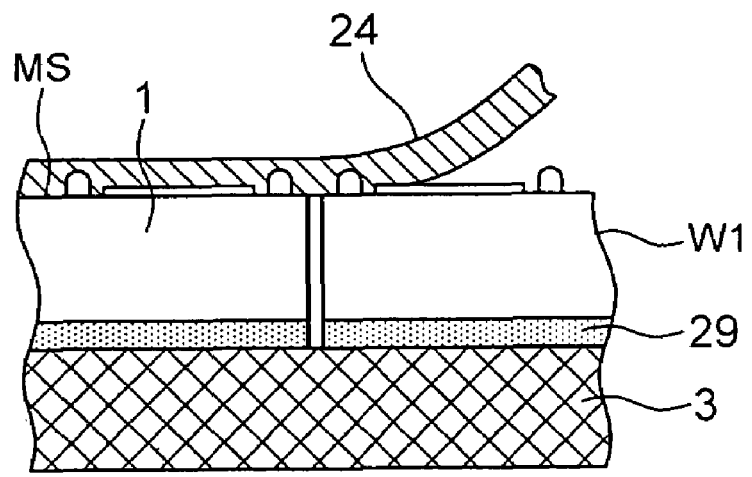

After the rear surface has been ground, an adhesive layer 29 such as the PSA tape is formed on the rear surface of the semiconductor wafer W1 (FIG. 5). Next, the adhesive layer 29 is cut into a chip size by use of cutting means such as laser or a blade (FIG. 6). Then, the PSA tape 24 is peeled off from the semiconductor wafer W1 which is held by a wafer sucking section provided on a holding table 3 and which has been broken into chips (FIG. 7).

The semiconductor chips 1 from which the PSA tape 24 has been peeled off and which constitute the semiconductor wafer W1 broken into pieces are picked up by a pickup mechanism so as to be transferred to a predetermined manufacturing process of the semiconductor device.

The PSA tape used here may be constituted of a thermoplastic film base material and an adhesive layer as is an ordinary surface protection tape, and may also be constituted of a thermal shrinkable film base material and the adhesive layer. The PSA tape constituted of the thermal shrinkable film base material and the adhesive layer is automatically peeled off from the semiconductor wafer by thermal contraction, so that a peeling mechanism described later may possibly be simplified. Moreover, an adhesive of the PSA tape may be a UV curable adhesive. In a process of peeling off the PSA tape, UV can be irradiated before peeling off the PSA tape to facilitate the peeling. In a process of forming the cut groove, any of blade dicing, laser, etching or cleaving can be used as means for providing the cut groove.

Furthermore, the rear surface can be etched after ground as described above to obtain a semiconductor chip with less chipping of the rear surface. The adhesive layer may be a thermally adhesive thermoplastic film, and may also be a thermosetting adhesive layer. Moreover, it may also be a thermosetting adhesive layer with UV curable properties. Since the thermosetting adhesive layer may be adhesive in an ordinary temperature area, the chips might be firmly fixed to an adhesion stage. If the thermosetting adhesive layer has the UV curable properties, the adhesive layer is affixed to the rear surface of the semiconductor wafer, and then the adhesive layer is UV-cured before adhering and being fixed to the adhesion stage so as to decrease adhesion, whereby the above problem is less likely to occur. Any of the blade, laser or etching can be used as the means for cutting the adhesive layer.

Next, an example of applying the semiconductor chips that constitute the semiconductor wafer broken into pieces to a die bonding process will be described referring to FIGS. 8 to 14C. In this process, a die bonder having a peeling mechanism for the PSA tape and a pickup mechanism for the semiconductor chips will be described as an example.

Figure 8:
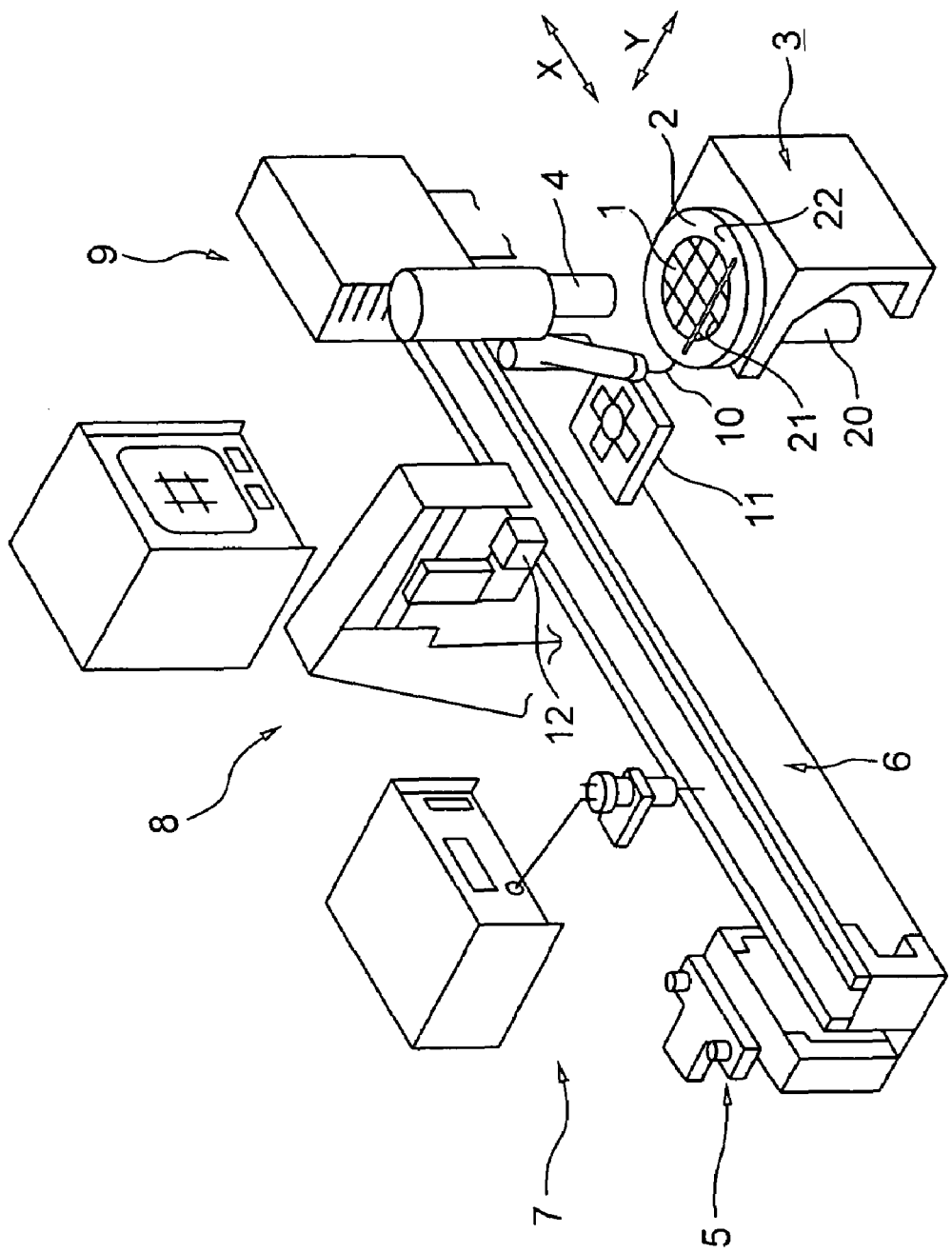
FIG. 8 is a perspective view showing a schematic configuration of the die bonder used in the first embodiment of the invention.
Figure 9A:
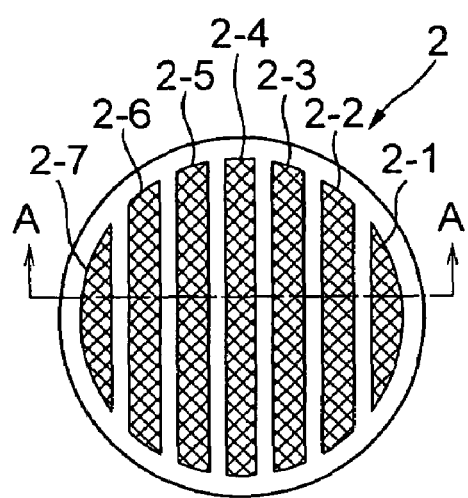
FIG. 9A is a plan view of the wafer sucking section of the die bonder of FIG. 8 used in the peeling process and the pickup process.
Figure 9B:
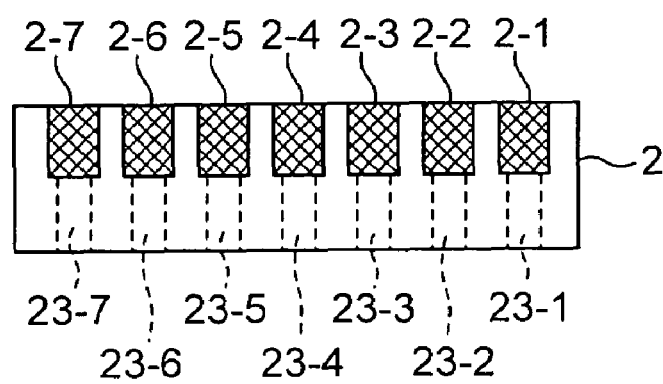
FIG. 9B is a sectional view along the line A—A of FIG. 9A.
Figure 11:
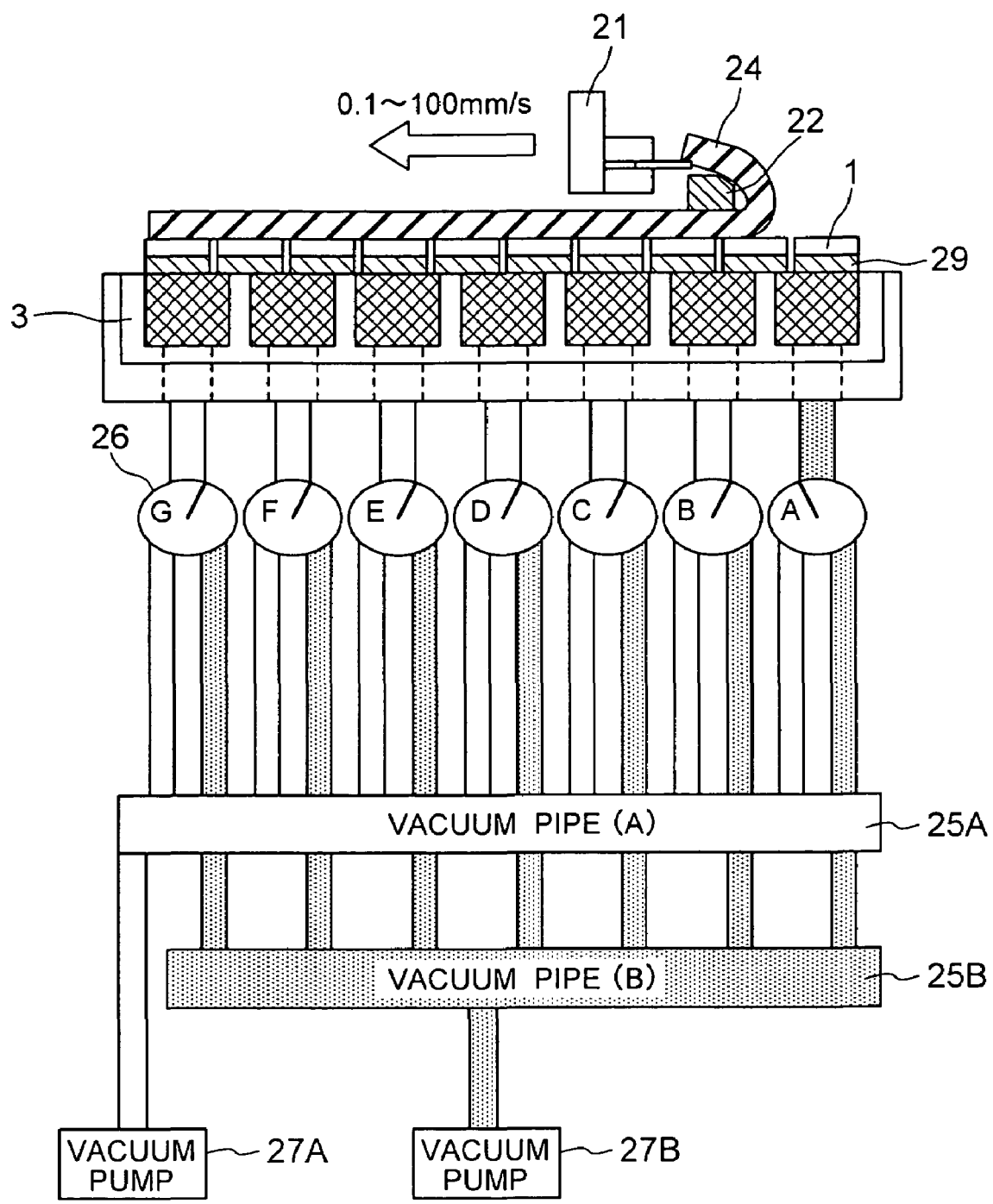
FIG. 11 is a sectional view explaining the peeling mechanism for the PSA tape that the die bonder shown in FIG. 8 comprises.
Figure 12:
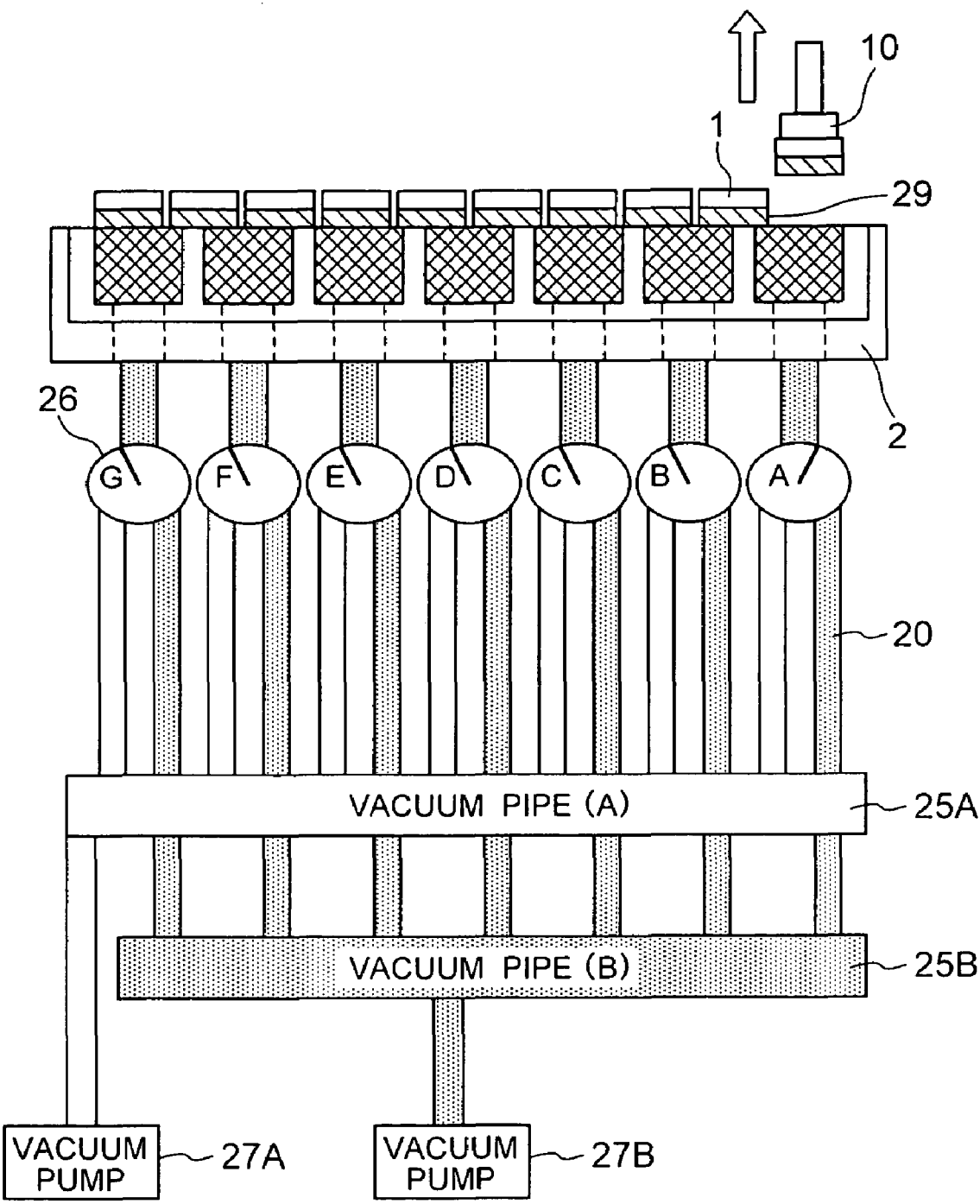
FIGS. 12 and 13 are sectional views explaining the pickup mechanism for the semiconductor chips that the die bonder shown in FIG. 8 comprises.
Figure 13:
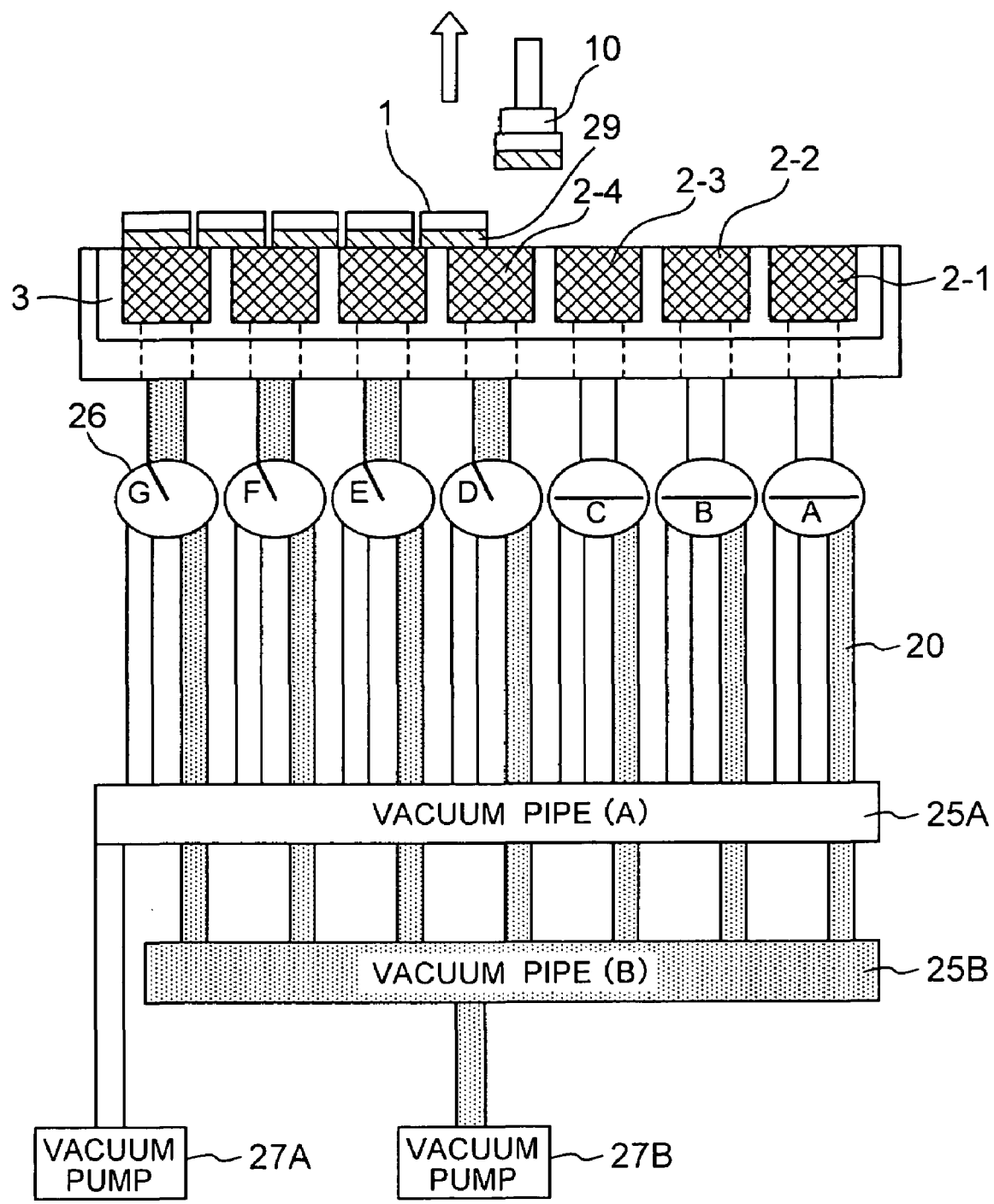
Figure 14A:
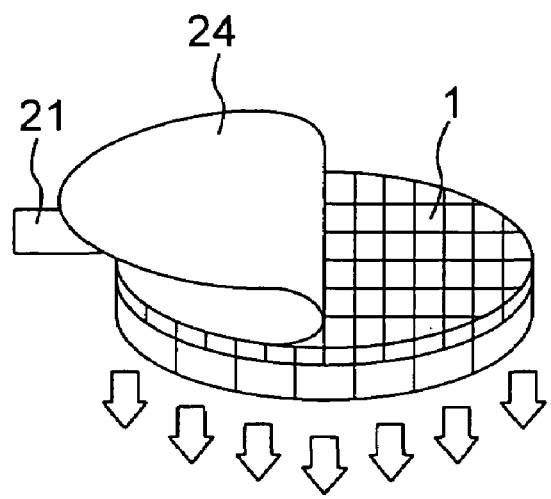
FIGS. 14A to 14C are schematic perspective views explaining a process of mounting the semiconductor chips picked up according to the present embodiment.
Figure 14B:
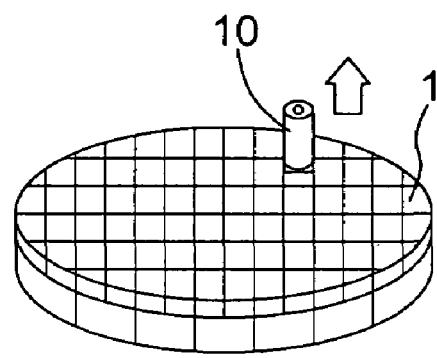
Figure 14C:
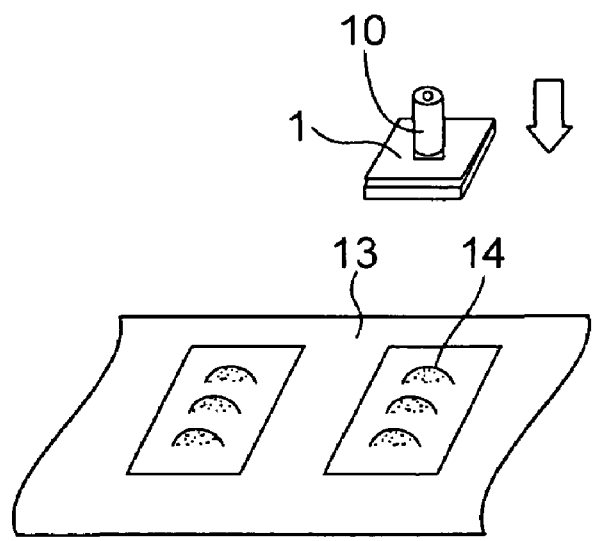

FIG. 8 is a perspective view showing a schematic configuration of the die bonder used in the present embodiment; FIG. 9A is a plan view of the wafer sucking section of the die bonder of FIG. 8 used in the peeling process and the pickup process, and FIG. 9B is a sectional view along the line A—A of FIG. 9A; FIGS. 10A to 10C are plan views explaining a positional relationship between the wafer sucking section shown in FIG. 8 and the semiconductor wafer broken to be separated into chips; FIG. 11 is a sectional view explaining the peeling mechanism for the PSA tape that the die bonder shown in FIG. 8 comprises; FIGS. 12 and 13 are sectional views explaining the pickup mechanism for the semiconductor chips that the die bonder shown in FIG. 8 comprises; and FIGS. 14A to 14C are schematic perspective views explaining a process of mounting the semiconductor chips picked up according to the present embodiment.

In the semiconductor wafer W1 shown in FIG. 7, the PSA tape 24 covers an entire element formation surface MS having an element formation area as the surface protection tape, and the adhesive layer 29 is formed on the rear surface. The adhesive layer 29 is separately formed for each of the semiconductor chips 1.

The die bonder shown in FIG. 8 comprises the mechanism for peeling off the PSA tape, the pickup mechanism for picking up the semiconductor chips, a transfer mechanism for transferring the semiconductor chips picked up onto a leadframe, and a conveying mechanism for conveying the leadframe. The peeling mechanism includes a holding table 3, a video camera 4, a peeling claw 21, an auxiliary plate 22 and a suction unit 20. The pickup mechanism includes the holding table 3, the video camera 4, a suction collet 10 and the suction unit 20. The peeling mechanism and the pickup mechanism share the holding table 3, the video camera 4 and the suction unit 20.

The holding table 3 has a porous member segmented into at least two sucking areas (into blocks) in a direction to peel off the PSA tape, for example, a wafer sucking section 2 having a film-like ceramic material/glass epoxy substrate. In this embodiment, as shown in FIGS. 9A and 9B, the wafer sucking section 2 has seven sucking areas 2-1 to 2-7. Under the sucking areas 2-1 to 2-7, connection holes 23-1 to 23-7 are provided for connecting vacuum pipes. On this wafer sucking section 2, the semiconductor chips 1, which have been formed from separation of the semiconductor wafer with elements having been finished, and which is affixed to the PSA tape 24 (refer to FIG. 11), adhere to and are fixed on a surface opposite to the element formation surface via the adhesive layer 29. At this moment, as shown in FIGS. 10A and 10B, if a longitudinal direction of the sucking areas 2-1 to 2-7 is disposed to be at right angles to a peeling direction, positions of the semiconductor chips 1 are easily identified during pickup. On the other hand, if diagonal lines of the semiconductor chips 1 are disposed in a direction parallel to the peeling direction (with an inclination of 45 degrees when the semiconductor chips are square) as shown in FIGS. 10A and 10C, the PSA tape 24 starts to be peeled off at corner portions of the semiconductor chips 1, making it easy to peel off. The size and thickness of the semiconductor chips 1, adhesion force of the PSA tape 24 and the like may be considered to decide which arrangement to select.

The holding table 3 moves the individual semiconductor chips 1 onto the suction unit 20 by moving the semiconductor wafer in an XY direction. The video camera 4 monitors the surface of the semiconductor chips 1. The suction unit 20 is disposed under the holding table 3, and has two vacuum (suction) pumps; a changeover valve for changing the vacuum pipes; and a controller for controlling the changeover valve; the two vacuum pumps corresponding to at least two systems of vacuum (suction) pipes that are provided in a manner corresponding to the sucking areas 2-1 to 2-7 of the wafer sucking section 2.

The transfer mechanism for transferring the semiconductor chips 1 onto the leadframe includes a bonding tool 8, the suction collet 10, a position correction stage 11, a bonding head 12 and the like. The suction collet 10 is also used in pickup, and sucks the semiconductor chips 1 peeled off from the PSA tape 24 and transfers them onto the position correction stage 11. The position of the semiconductor chip 1 is corrected on the position correction stage 11. The semiconductor chips 1 whose position is corrected are transferred onto the leadframe by the bonding head 12. Furthermore, the conveying mechanism for conveying the leadframe includes a leadframe supplying section 5, a leadframe conveying unit 6, a paste conveying unit 7 and a leadframe housing section 9. The leadframe supplying section 5 stores the leadframe before die bonding, and sequentially sends out the leadframe to the leadframe conveying unit 6. The paste conveying unit 7 applies a conductive paste to a bed portion of the leadframe conveyed by the leadframe conveying unit 6. Further, the leadframe housing section 9 stores the leadframe to which the die bonding has been finished.

A whole schematic operation of the die bonder shown in FIG. 8 is as follows.

First, the semiconductor wafer W1, which has the PSA tape 24 affixed onto its element formation surface side and has the adhesive layer 29 formed on its rear surface for each chip, is mounted on the holding table 3. Next, the semiconductor chip 1 is directly sucked by the suction unit 20 and fixed on the wafer sucking section 2, and the PSA tape 24 is peeled off by use of the peeling claw 21 and the auxiliary plate 22. Subsequently, the holding table 3 is moved in the XY direction, and the surface of the semiconductor chip 1 is monitored using the video camera 4, and image data obtained with this monitor is binarized or multi-valued to conduct detection such as positional detection and mark detection for identification of non-defective/defective products for the semiconductor chips 1. Moreover, the semiconductor chip 1 is held by the suction collet 10 while being sucked by the vacuum of the suction unit 20 (not always need to be sucked by vacuum depending on the size and thickness of the semiconductor chip) so that they are picked up and transferred onto the position correction stage 11. After the position and, if needed, a positional relationship between the front and back of the semiconductor chip 1 are corrected, it is transferred onto the leadframe by the bonding head 12.

After the pickup is finished, the holding table 3 is moved to a position of the semiconductor chip 1 to be picked up next. This operation is repeated.

On the other hand, the leadframe supplying section 5 sequentially sends out the leadframe to the leadframe conveying unit 6. By the paste conveying unit 7, the conductive paste is applied to the bed portion of the leadframe conveyed by the leadframe conveying unit 6. Further, the semiconductor chip 1 transferred by the bonding head 12 is mounted on the bed portion of the leadframe (this is called the die bonding). The leadframe housing section 9 stores the leadframe to which the die bonding is finished. The above operation is sequentially repeated.

Next, the mechanism for peeling off the PSA tape and the pickup mechanism for the semiconductor chips, and a peeling method and pickup method using those mechanisms in the die bonder mentioned above will be described in detail with reference to FIG. 11 to FIG. 14C.

First, the PSA tape 24 is affixed to the element formation surface, and the semiconductor wafer W1 broken to be separated into chips is prepared. The semiconductor wafer W1 is comprised of the semiconductor chips 1 whose rear surfaces are covered with the adhesive layer 29. Further, as described above, the PSA tape 24 serves as the surface protection tape or a support tape of the semiconductor wafer. The semiconductor wafer W1 broken to be separated into chips is set on the holding table 3. The holding table 3 is provided with two systems of vacuum pipes 25A and 25B, changeover valves 26A to 26G of the pipes and two vacuum pumps 27A and 27B, and these are used to peel off the PSA tape 24. The vacuum pipe 25A of a first system and the first vacuum pump 27A are first used to vacuum-suck the semiconductor wafer W1 adhesively bonded to the PSA tape 24 and fix it on the wafer sucking section 2. In this state, the PSA tape 24 starts to be peeled off.

In peeling, a tape for peeling is adhesively bonded to an edge side of the PSA tape 24, and the other edge thereof is held by the peeling claw 21, and the auxiliary plate 22 to aid in peeling is set to an upper portion of the PSA tape 24, and then one edge of the PSA tape 24 is pulled at a speed of 0.1 mm to 100 mm/sec, preferably at a speed of 0.1 mm to 10 mm/sec in an arrow direction shown in the drawing by the peeling claw 21 while an upper surface of the PSA tape 24 is being held by the auxiliary plate 22 to bend the PSA tape 24. At this time, the peeling claw 21 may be pulled with a variable force, and the peeling claw 21 and the auxiliary plate 22 may be moved at a fixed speed for peeling. Moreover, an operation for, after pulling for a certain distance by the peeling claw 21, holding the upper surface of the PSA tape 24 with the auxiliary plate 22 may be repeated. Further, when part of the PSA tape 24 in the vicinity of the adjacent sucking areas 2-1 to 2-7 of the wafer sucking section 2 is peeled off, the vacuum pipe 25B of the second system is changed to by the changeover valves 26A to 26G, and the peeled semiconductor chips 1 in the sucking areas are sucked by use of the second vacuum pump 27B and fixed on the wafer sucking section 2. FIG. 11 shows a state in which the peeling has proceeded to a boundary area between the sucking area 2-1 and the sucking area 2-2, and the changeover valve 26A has been changed.

In the same manner, the changeover valves 26-B to 26-G will be sequentially changed as the PSA tape 24 is peeled off. Further, with the PSA tape 24 completely peeled off, each of the semiconductor chips 1 is transferred from the PSA tape 24 to the wafer sucking section 2, and each of the semiconductor chips 1 is sucked and fixed by the second vacuum pump 27B via the vacuum pipe 25B of the second system. It should be understood that the auxiliary plate 22 may has a rounded tip, or a sharp tip can be used. The shape of the edge is decided by the thickness, adhesion force, flexibility and the like of the PSA tape 24. Next, the position and defectiveness of the semiconductor chips 1 are detected. Subsequently, each of the semiconductor chips 1 starts to be picked up from the wafer sucking section 2. Each of the semiconductor chips 1 is sucked and fixed by the second vacuum pump 27B via the vacuum pipe 25B of the second system shortly after the start of pickup, and in this state, it is picked up only by suction force using the suction collet 10.

Furthermore, when the pickup has progressed to come to the vicinity of a boundary of the sucking area, the changeover valves are changed to change to the vacuum pipe 25A of the first system, and the sucking area in which the semiconductor chip has been picked up by use of the first vacuum pump 27A is sucked. FIG. 12 shows a state in which the pickup has been almost finished up to the sucking area 2-1, and the changeover valve 26A corresponding to the sucking area 2-1 is closed.

In this way, the semiconductor chip 1 is picked up and part of the wafer sucking section 2 is then exposed, thereby making it possible to prevent the suction force of the second vacuum pump 27B from being decreased, and to suck defective chips remaining on the exposed wafer sucking section 2 and chips at a peripheral portion of the wafer that will not be products, and fix them on the wafer sucking section 2. It should be understood that when the pickup has progressed to pick up the semiconductor chips 1 in the sucking areas, the changeover valves may be closed to stop the suction, as shown in FIG. 13. FIG. 13 shows a state in which the pickup has progressed to the sucking area 2-4, and the changeover valves 26-A to 26-C corresponding to the sucking areas 2-1 to 2-3 are closed.

Subsequently, the leadframe is die-bonded, as shown in FIGS. 14A to 14C. FIG. 14A schematically shows the peeling process for the PSA tape 24, FIG. 14B schematically shows the pickup process, and FIG. 14C schematically shows a process of mounting the semiconductor chip 1 to a leadframe 13 with a conductive paste 14 or the like. Furthermore, defective products and the semiconductor chips 1 that will not be products in an outer peripheral portion of the wafer are destroyed.

According to the configuration and method described above, the semiconductor wafer broken into pieces can be effectively sucked and fixed with the most suitable suction force adapted to the peeled position of the PSA tape and a pickup state of the semiconductor chips, so that cracks and chipping of the semiconductor chips during the peeling of the PSA tape or during the pickup can be prevented which will be the problem due to the reduced thickness of the semiconductor chips. Moreover, the pickup is performed only by adhesion, so that the semiconductor chips can be prevented from being damaged in the portion where raising pins contact, which has been a problem associated with the pickup using conventional raising pins. Further, as the adhesive layer is formed, stacked MCP products in which the semiconductor chips are stacked can easily be produced.

Cracks have often occurred (100 pcs/100 pcs) when the semiconductor chip is picked up if the thickness of the semiconductor chip is 50 µm or less in the prior art. According to this embodiment, however, the occurrence of the cracks can be reduced to an almost negligible degree (0/100 pcs) even if the thickness of the semiconductor chip is 50 µm or less.

In addition, the die bonder has been described as an example in this embodiment, but the manufacturing method of this embodiment is also applicable to other devices that require the mechanism for peeling off the PSA tape and the pickup mechanism for the semiconductor chips. Such devices include, for example, a picker for, after peeling off the PSA tape, picking up each of the semiconductor chips to put it on a tray; a flip chip bonder for, after peeling off the PSA tape, picking up each of the semiconductor chips to mount it onto a printed circuit board by flip chip connection; a film adhesive bonder for, after peeling off the PSA tape, picking up each of the semiconductor chips to mount it on a thermoplastic film substrate; an inner lead bonder for, after peeling off the PSA tape, picking up each of the semiconductor chips 1 to mount it onto a TAB tape by use of heating tools.

Next, a second embodiment will be described referring to FIGS. 15 to 18C.

Figure 15:
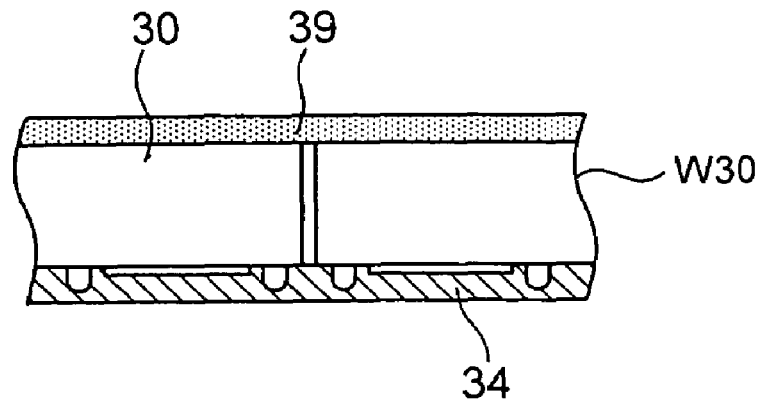
FIGS. 15 to 17 are process sectional views explaining processes in which a PSA tape affixed to the semiconductor wafer on which a semiconductor element is formed and which is broken into semiconductor chips is peeled off and an adhesive layer is thereafter cut into a chip size according to a second embodiment of the present invention.
Figure 16:
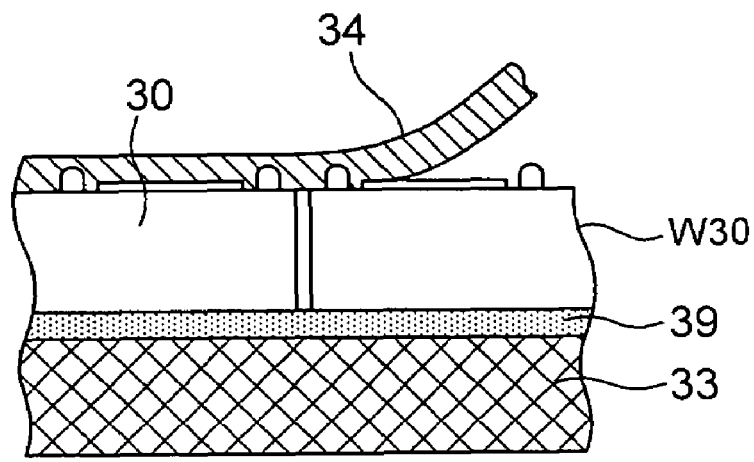
Figure 17:
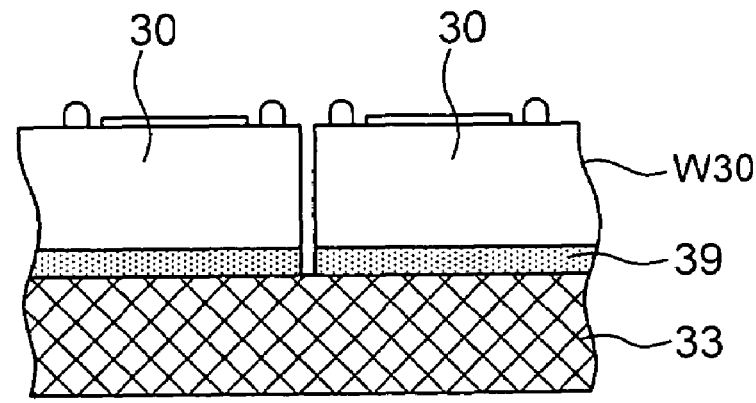

FIGS. 15 to 17 are process sectional views explaining a process in which the semiconductor element is formed on a semiconductor wafer W30 before the semiconductor wafer W30 is broken into semiconductor chips 30, a PSA tape 34 affixed to the semiconductor wafer W30 is peeled off, and an adhesive layer 39 on the semiconductor wafer W30 is then cut into the chip size. The process of grinding the rear surface is substantially the same as in the first embodiment described above (FIGS. 1 to 4), and therefore, the description thereof will not be repeated.

After the rear surface has been ground, the adhesive layer 39 such as a PSA tape is formed on the rear surface of the semiconductor wafer W30 (FIG. 15). Next, the PSA tape 34 is peeled off from the semiconductor wafer W30 which is held by the wafer sucking section provided on a holding table 33 and which has already been broken into chips (FIG. 16). Next, the adhesive layer 39 is cut into the chip size on the holding table 33 by use of cutting means such as the laser or the blade (FIG. 17). The semiconductor chips 30 from which the PSA tape 34 is peeled off and which constitute the semiconductor wafer W30 broken into pieces are picked up by the pickup mechanism (see FIG. 8) so as to be transferred to the predetermined manufacturing process implemented by the semiconductor device.

Figure 18A:
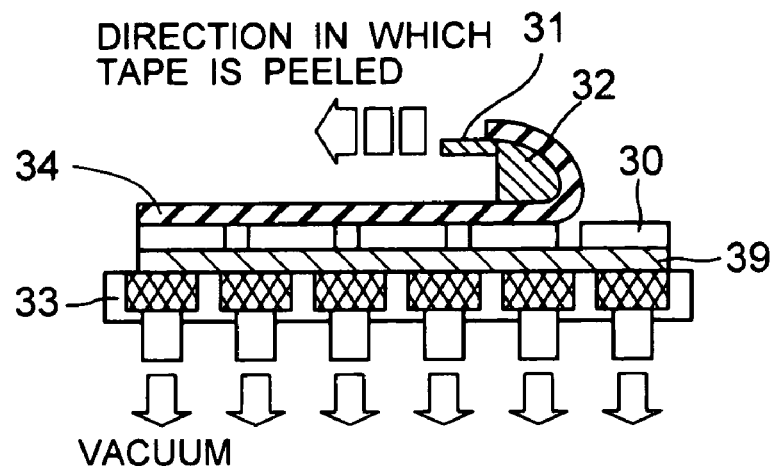
FIGS. 18A to 18C are sectional views of the peeling mechanism and the pickup mechanism for explanation from the process of peeling off the PSA tape to the process of picking up the semiconductor chip in accordance with the second embodiment of the present invention.
Figure 18B:
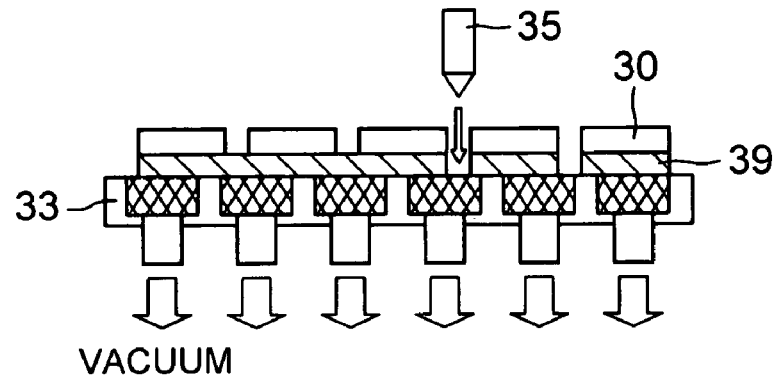
Figure 18C:
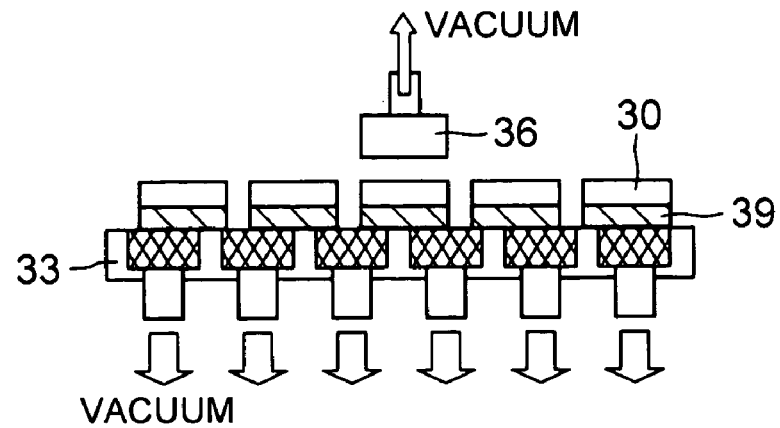

Next, the peeling process for the PSA tape through the pickup process for picking up the semiconductor chips will be described referring to FIGS. 18A to 18C. In the semiconductor wafer W30 shown in these drawings, the PSA tape 34 covers the entire element formation surface having the element formation area as the surface protection tape, and the adhesive layer 39 such as an adhesive sheet or an adhesive film is formed on the rear surface. The adhesive layer 39 is formed on the entire surface of the semiconductor wafer.

First, the PSA tape 34 is peeled off from the surface of the semiconductor wafer W30 by use of a peeling claw 31 and an auxiliary plate 32 while the semiconductor wafer W30 is directly sucked by the suction unit 20 on the holding table 33 and fixed on the holding table 33. At this moment, the semiconductor wafer W30 is fixed with vacuum on the table 33 which is connected to the vacuum pipes arranged in two or more systems in accordance with the sucking areas divided into two or more, and the pipe systems of porous blocks are switched therebetween in accordance with the state at which the PSA tape 34 is peeled, thereby peeling off the PSA tape 34 (FIG. 18A). Subsequently, the adhesive layer 39 is cut into the chip size by use of cutting means 35 such as the laser or the blade. Also in this case, the semiconductor wafer W30 is fixed with vacuum on the table 33 which is connected to the vacuum pipes arranged in two or more systems in accordance with the sucking areas divided into two or more, and the pipe systems connected to the porous blocks are switched in accordance with a cutting state to cut the adhesive layer 39 (FIG. 18B). Subsequently, each of semiconductor chips 30 starts to be picked up from the wafer sucking section 33. Shortly after the start of pickup, each of the semiconductor chips 30 is picked up only by suction force using a suction collet 36 (FIG. 18C). Each of the semiconductor chips 30 picked up is bonded to the leadframe or the like. The laser as the cutting means includes a YAG laser, a $CO_2$ laser and a single pulse laser.

The PSA tape used here may be constituted of the thermoplastic film base material and the adhesive layer as is the ordinary surface protection tape, and may also be constituted of the thermal shrinkable film base material and the adhesive layer. Since the PSA tape constituted of the thermal shrinkable film base material and the adhesive layer is automatically peeled off from the semiconductor wafer by thermal contraction, it is possible that the peeling mechanism described later may be simplified. Moreover, an adhesive of the PSA tape may be the UV curable adhesive. In a process of peeling off the PSA tape, UV can be irradiated before peeling off the PSA tape to facilitate the peeling. In a process of forming the cut groove, any of the blade dicing, laser, etching or cleaving can be used as means for providing the cut groove.

Furthermore, the rear surface can be etched after ground to obtain a semiconductor chip with less chipping of the rear surface. The adhesive layer may be the thermally adhesive thermoplastic film, and may also be the thermosetting adhesive layer. Moreover, it may also be a thermosetting adhesive layer with UV curable properties. Since the thermosetting adhesive layer may be adhesive in an ordinary temperature area, the chips might be firmly fixed to the adhesion stage. If the thermosetting adhesive layer has the UV curable properties, the adhesive layer is affixed to the rear surface of the semiconductor wafer, and then the adhesive layer is UV-cured before adhering and being fixed to the adhesion stage so as to decrease adhesion, whereby the above problem is less likely to occur. Any of the blade, laser or etching can be used as the cutting means for cutting the adhesive layer on the porous member.

As described above, according to this embodiment, the semiconductor wafer broken to be separated into chips can be effectively sucked and fixed with the most suitable suction force adapted to the position at which the PSA tape is peeled and the state in which the semiconductor chips are picked up, so that cracks and chipping of the semiconductor chips during the peeling of the PSA tape or during the pickup can be prevented, which would be the problem due to the reduced thickness of the semiconductor chips. Moreover, the pickup is performed only by suction, so that damage to the portion of the semiconductor chips where the raising pins contact can be prevented, which has been a problem associated with the pickup using conventional raising pins. Further, as the adhesive layer is formed, the stacked MCP products in which the semiconductor chips are stacked can easily be produced.

Next, a third embodiment of the present invention will be described referring to FIGS. 19A to 22.

This embodiment is characterized in handling the semiconductor wafer which has a low dielectric constant insulation film (usually called a low-k film) formed on the element formation surface, the PSA tape (surface protection tape) affixed in contact with this low dielectric constant insulation film, and the adhesive layer formed on the entire surface opposite to the element formation surface.

An fluorine-doped silicon oxide film (relative dielectric constant 3.4 to 3.7) having a relative dielectric constant lower than that of a silicon oxide film (3.9 to 4.1) is widely used as a material of the low dielectric constant insulation film, for example, when it is used in a semiconductor device.

The low dielectric constant insulation film can be classified into two kinds of materials. The first kind is a material in which the relative dielectric constant is decreased by lowering the density of the silicon oxide film (relative dielectric constant 3.9 to 4.1), and includes, for example, MSQ (Methyl Silsesquioxane: $CH_3—SiO_{1.5}$ (relative dielectric constant 2.7 to 3.0)), H (Hydrogen Silsesquioxane: $H—SiO_{1.5}$ (relative dielectric constant 3.5 to 3.8)), porous HSQ ($H—SiO_{1.5}$ (relative dielectric constant 2.2)), and porous MSQ ($CH_3—SiO_{1.5}$ (relative dielectric constant 2.0 to 2.5)), which are all based on a coating method. A material based on a plasma CVD method includes organic silica ($CH_3—SiO_{1.5}$ (relative dielectric constant 2.5 to 3.0)) and the like. In this embodiment, the low dielectric constant insulation film called the low-k film is a film whose relative dielectric constant is below 3.9. The second kind is a material having a low polarizability in an organic film. For example, this includes PTFE (Polytetrafluoroethylene (relative dielectric constant 2.1)), PAE (Polyarylether: relative dielectric constant 2.7 to 2.9), porous PAE (relative dielectric constant 2.0 to 2.2), and BCB (Benzocyclobutene: relative dielectric constant 2.6 to 3.3). All of these can be formed into a film by the coating method such as spin coating.

FIGS. 19A to 19D are process sectional views explaining a process in which the semiconductor element is formed on the element formation surface, and after the semiconductor wafer in which the low dielectric constant insulation film is formed on this element formation surface is affixed on the PSA tape and then broken to be separated into the semiconductor chips, the PSA tape is peeled off, and then the adhesive layer of the semiconductor wafer and the low dielectric constant insulation film are cut into the chip size, and the low dielectric constant insulation film is fused. The process of grinding the rear surface is substantially the same as in the first embodiment described above (refer to FIGS. 1 to 4), and therefore, the description thereof will not be repeated.

Figure 19A:
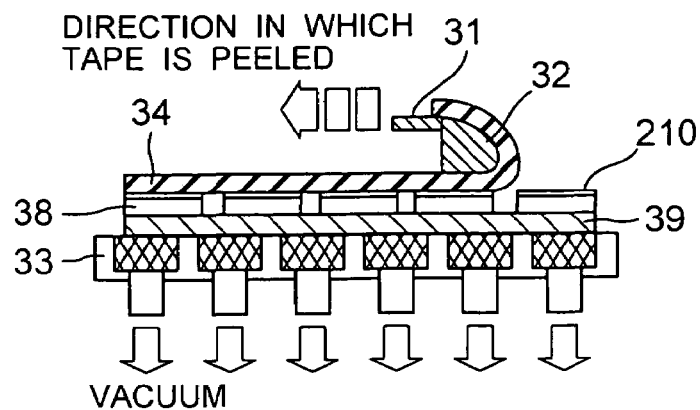
FIGS. 19A to 19D are process sectional views explaining processes in which a semiconductor wafer having an element formation surface on which an element is formed and a low dielectric constant insulation film formed on the element formation surface is broken to be separated into semiconductor chips, a PSA tape is then peeled and the low dielectric constant insulation film is fused.

The semiconductor wafer shown in FIG. 19A has already been broken into the semiconductor chips 39, and has the adhesive layer 39 formed on the surface opposite to the element formation surface. The semiconductor element is sealed with a resin, and a low dielectric constant insulation film 210 is formed in contact with the sealing resin, and the PSA tape 34 covers the entire element formation surface of the semiconductor wafer so as to contact the low dielectric constant insulation film 210.

Figure 19B:
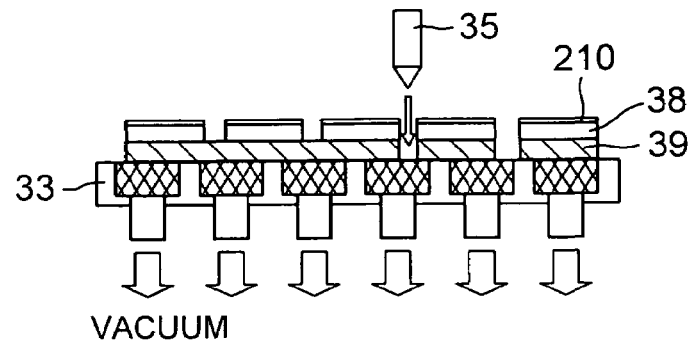
Figure 19C:
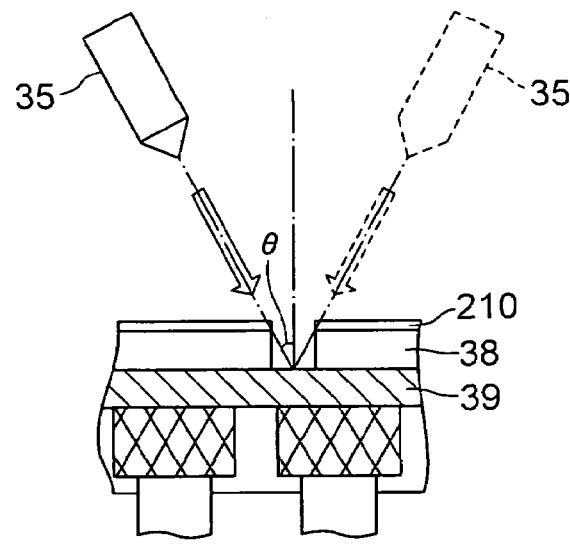

As shown in FIG. 19A, the PSA tape 34 is first peeled off from the surface of the semiconductor wafer by use of the peeling claw 31 and the auxiliary plate 32 while the semiconductor wafer is directly sucked by the suction unit 20 and fixed on the holding table 33. At this moment, the semiconductor wafer W30 is fixed with vacuum on the table 33 which is connected to the vacuum pipes arranged in two or more systems in accordance with the sucking areas divided into two or more, and the pipe systems of porous blocks are switched in accordance with a state at which the PSA tape 34 is peeled, thereby peeling off the PSA tape 34 (FIG. 19A). Subsequently, the adhesive layer 39 is cut into the chip size by use of the cutting means 35 such as the laser or the blade. In this case, the semiconductor wafer W30 is fixed with vacuum on the table 33 which is connected to the vacuum pipes arranged in two or more systems in accordance with the sucking areas divided into two or more, and the pipe systems connected to the porous blocks are switched in accordance with the cutting state to cut the adhesive layer 39 (FIG. 19B). In parallel with the cutting of the adhesive layer 39 or after the cutting of the adhesive layer 39, a peripheral edge of the low dielectric constant insulation film 210 is fused. In this embodiment, the laser is applied to the peripheral edge of the low dielectric constant insulation film 210 with an incidence angle θ of 20° to 40° (FIG. 19C). In this way, the low dielectric constant insulation film 210, which has once been fused, is fixed to the sealing resin with high adhesion when returning to an original temperature. As a result, the semiconductor chips in which the film is not easily peeled can be obtained. When the laser is used as the cutting means 35, this cutting means 35 may merely be used.

Figure 19D:
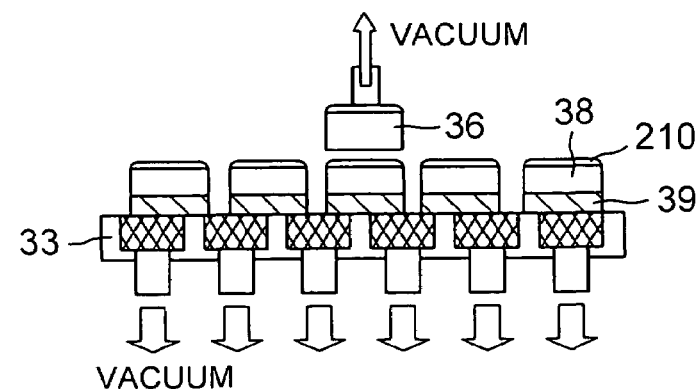

Subsequently, each of separated semiconductor chips 38 is picked up from the wafer sucking section. Shortly after the start of pickup, each of the semiconductor chips 38 is picked up only by suction force using the suction collet 36 (FIG. 19D). Each of the semiconductor chips 38 picked up is bonded to the leadframe or the like.

Figure 20A:
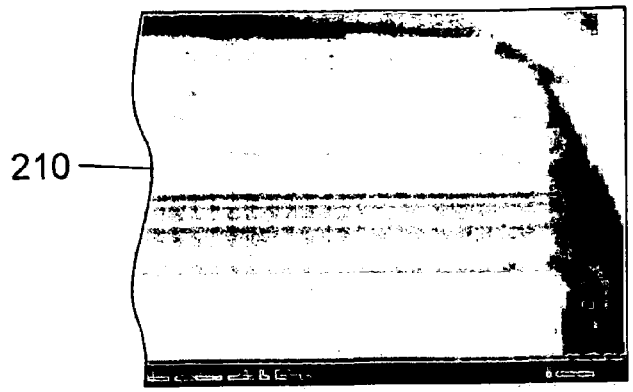
FIGS. 20A to 20D and 21 are schematic views of a comparison example for explaining the second embodiment of the present invention.
Figure 20B:
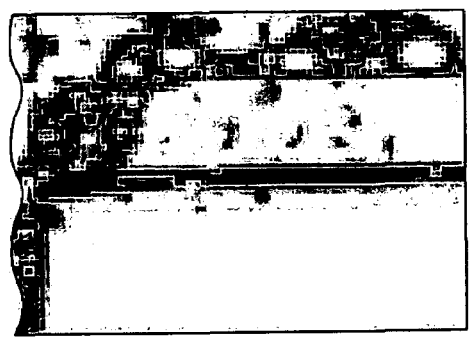
Figure 20C:
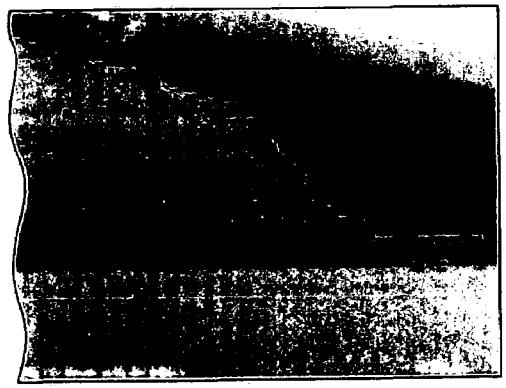
Figure 20D:
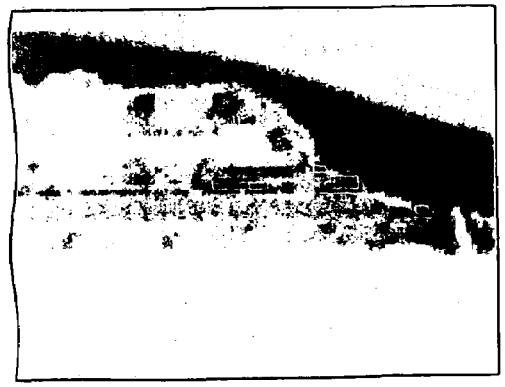
Figure 21:
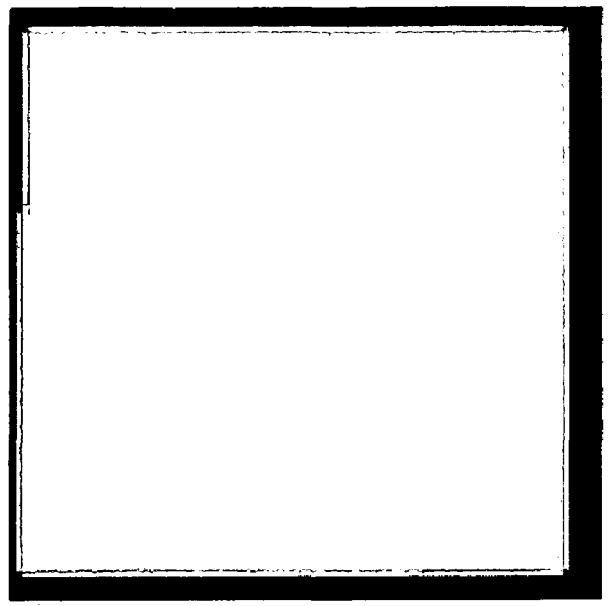
Figure 22:
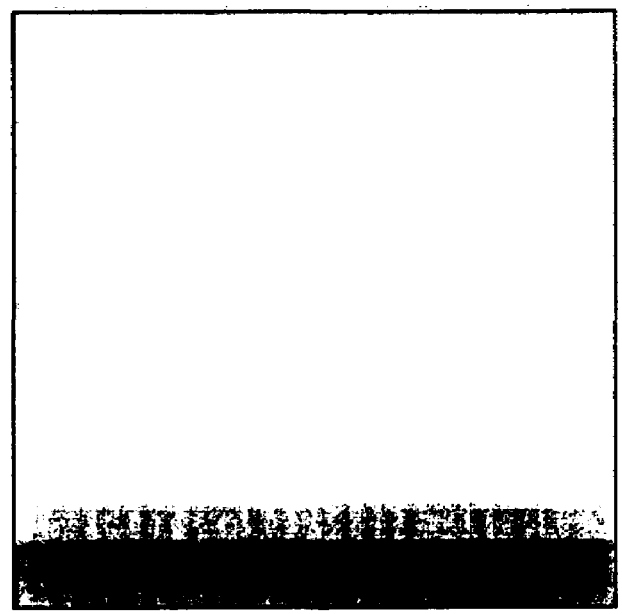
FIG. 22 is a schematic view showing effects of the second embodiment of the present invention.
Figure 23:
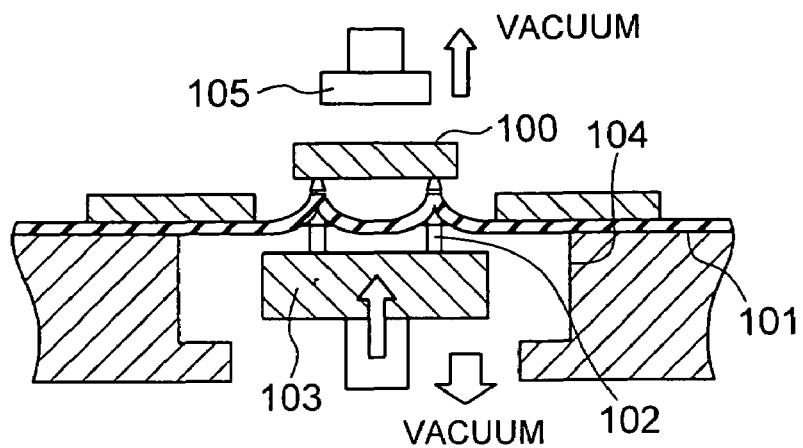
FIG. 23 is an enlarged sectional view of essential components of an example of a conventional pickup device.
Figure 24A:
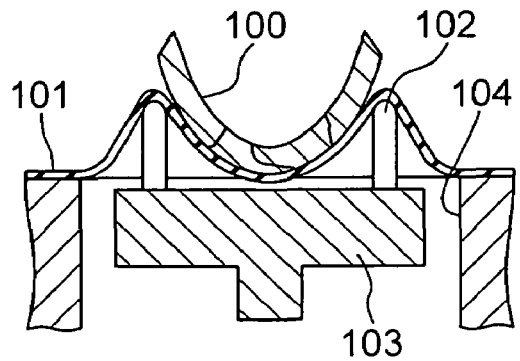
FIGS. 24A and 25A are cross sectional views explaining conventional cracks which might occur to semiconductor chips having thickness of less than 100 µm.
Figure 24B:
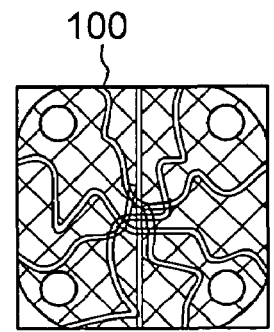
FIGS. 24B and 25B are plan views of the semiconductor chips shown in FIGS. 24A and 24B, respectively.
Figure 25A:
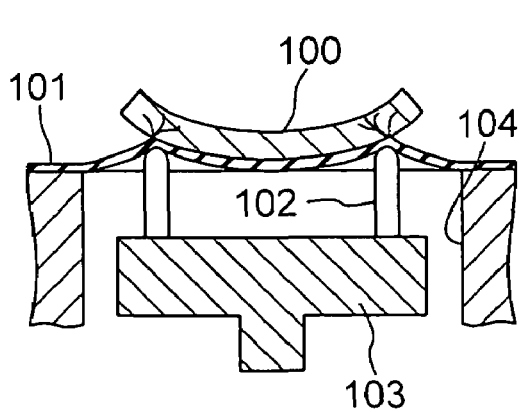
Figure 25B:
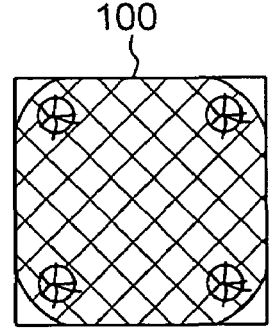
Figure 26:
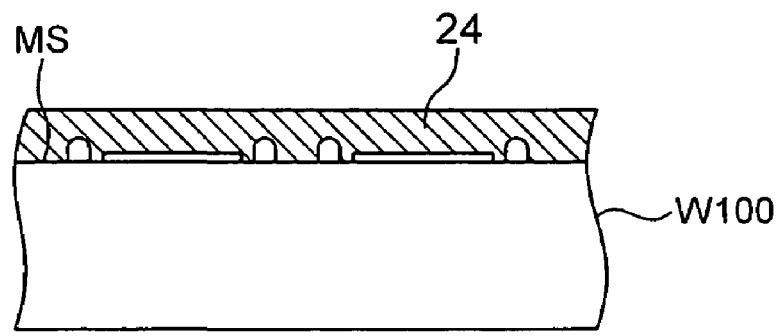
FIGS. 26 to 31 are process sectional views explaining a conventional manufacturing process of the stacked MCP product up to the production of the semiconductor chips.
Figure 27:
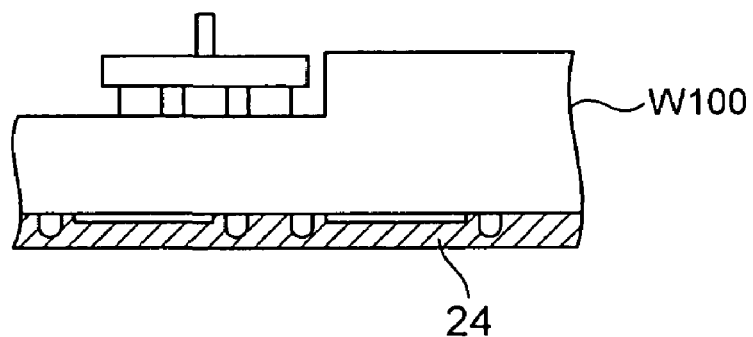
Figure 28:
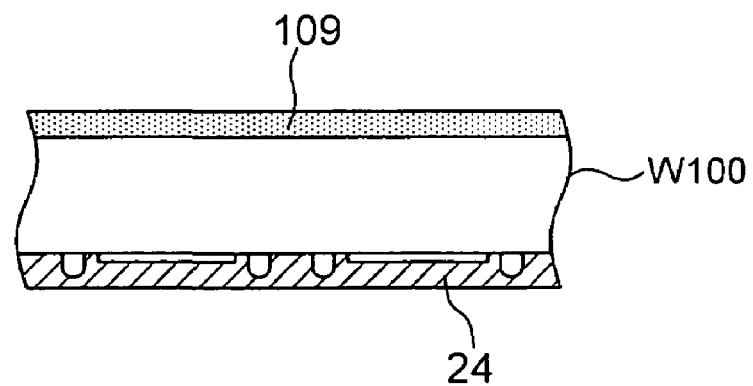
Figure 29:
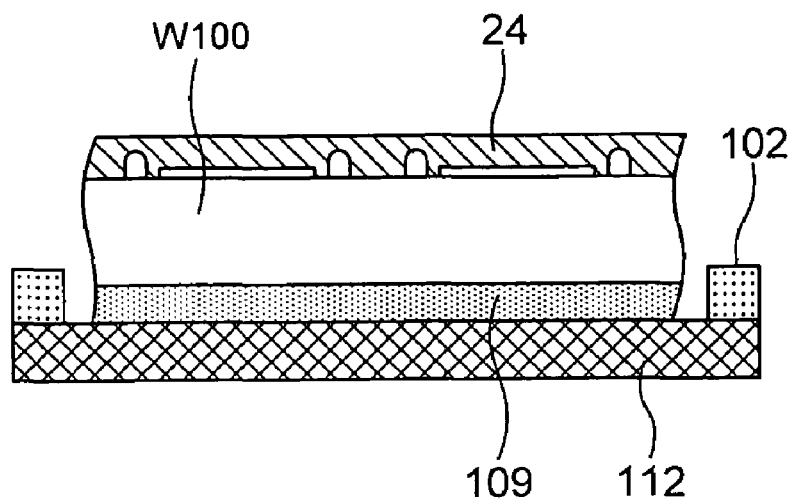
Figure 30:
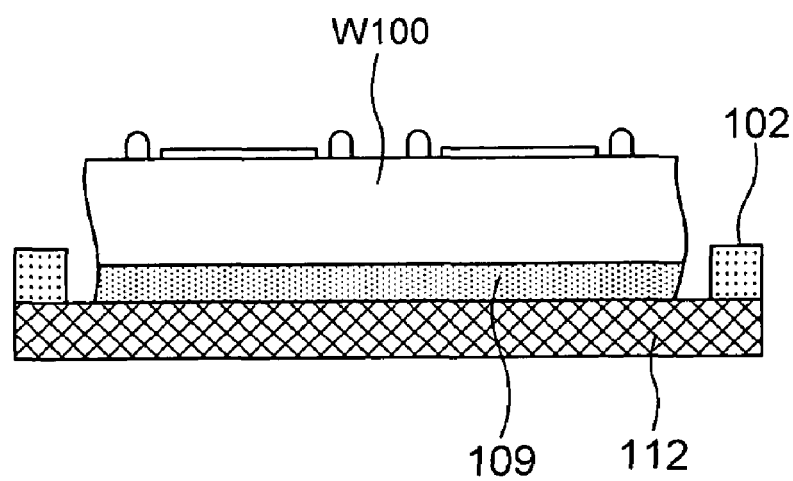
Figure 31:
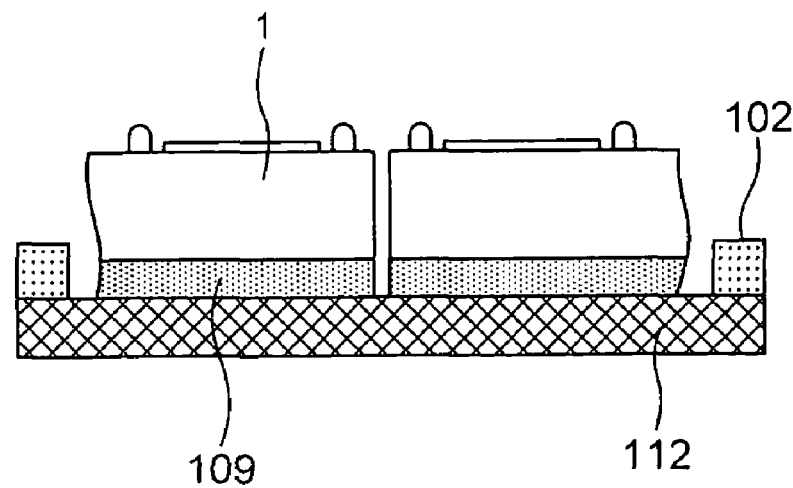

As described above, according to this embodiment, it is possible to obtain the semiconductor device from which the cracks and chipping mentioned above are prevented, and which has the low dielectric constant insulation film that is fixed to the sealing resin in the element formation area of each of the semiconductor chips with high adhesion. Effects of this embodiment will be described referring to FIG. 20A to FIG. 22. FIG. 20A to FIG. 20D and FIG. 21 are schematic views of a comparison example and FIG. 22 is a schematic view showing the effects of the present embodiment. FIG. 20A is an enlarged end portion view of a conventional semiconductor chip formed from the semiconductor wafer by use of the blade, and FIG. 20B is an enlarged end portion view after a thermal cycle test (hereinafter simply referred to as TCT) is performed on the chip of FIG. 20A 500 times. Moreover, FIG. 20C is an enlarged end portion view of the conventional semiconductor chip formed from the semiconductor wafer by use of the laser, and FIG. 20D is an enlarged end portion view after the TCT is similarly performed on the chip of FIG. 20C 500 times. It has been found out that when the blade is used, a number of bubbles are produced after the TCT as shown in FIG. 20B even if a favorable condition has been presented immediately after the cutting as shown in FIG. 20A, and a number of minute cracks are present. When the laser is used, no abnormalities are shown after the TCT, but as shown in the schematic view of FIG. 20D and the plan view of FIG. 21, destruction of the low dielectric constant insulation film has been confirmed. When the fusing process of this embodiment has been performed, the satisfactory low dielectric constant insulation film without being peeled can be confirmed, as shown in a plan view of FIG. 22.

While the embodiments of the present invention have been described above, the present invention is not limited to these embodiments and can be variously modified within the scope of claims set forth below. Moreover, these embodiments include various stages of the invention, and various inventions can be extracted by proper combinations of a plurality of constituting requirements to be disclosed. For example, in the dicing process before grinding the semiconductor wafer is processed to reduce the thickness thereof by grinding it from its rear surface with a grind stone. The present invention is, however, never limited to such process. The thickness of the semiconductor wafer may be reduced through, for example, an etching process. In addition, it has been described in the third embodiment that the adhesive layer 39 is formed on the entire rear surface of the semiconductor wafer. However, the process of fusing the low dielectric constant insulation film is not limited to this form, and application is naturally possible also to a case in which the adhesive layer is formed on the rear surface of each of the semiconductor chips, and thus the adhesive layer does not need to be cut. Moreover, the above-mentioned process of fusing the low dielectric constant insulation film can be applied in parallel with the process of breaking the semiconductor wafer into pieces.

What is claimed is:

1. A manufacturing method of a semiconductor device, comprising:

providing a groove having a thickness equal to or larger than a finishing thickness on a first surface of a semiconductor wafer on which a semiconductor element is formed;

affixing a pressure sensitive adhesive (PSA) tape onto the first surface of the semiconductor wafer in which the groove is formed;

reducing the thickness of the semiconductor wafer by processing a second surface opposite to the first surface of the semiconductor wafer onto which the PSA tape is affixed, so as to separate the semiconductor wafer into a plurality of semiconductor chips on which the semiconductor element is formed;

affixing an adhesive layer onto an entire rear surface of the separated semiconductor wafer;

cutting the adhesive layer so as to separate the adhesive layer for each of the semiconductor chips; and peeling off the PSA tape from the semiconductor wafer while fixing the semiconductor wafer under suction by use of a porous member segmented into at least two sucking areas;

wherein peeling off the PSA tape includes:

fixing the semiconductor wafer onto the porous member by sucking the semiconductor wafer with at least two systems of suction paths in association with the sucking areas in the direction in which the PSA tape is peeled off; and when the PSA tape is peeled off along the peeling direction and part of the PSA tape is peeled off in one of the sucking areas adjacent to each other, switching the suction paths therebetween in the vicinity of the other adjacent sucking area which the peeling of the PSA tape approaches so as to suck the semiconductor wafer, thereby fixing the semiconductor wafer onto the porous member in the other sucking area, the adhesive layer is cut in parallel with a control for switch between the at least two or more systems of suction paths in response to the state in which the adhesive layer is cut.

2. A manufacturing method of a semiconductor device, comprising:

providing a groove having a thickness equal to or larger than a finishing thickness on a first surface of a semiconductor wafer on which a semiconductor element is formed;

affixing a pressure sensitive adhesive (PSA) tape onto the first surface of the semiconductor wafer in which the groove is formed;

reducing the thickness of the semiconductor wafer by processing a second surface opposite to the first surface of the semiconductor wafer onto which the PSA tape is affixed, so as to separate the semiconductor wafer into a plurality of semiconductor chips on which the semiconductor element is formed;

affixing an adhesive layer onto an entire rear surface of the separated semiconductor wafer;

cutting the adhesive layer so as to separate the adhesive layer for each of the semiconductor chips; and peeling off the PSA tape from the semiconductor wafer while fixing the semiconductor wafer under suction by use of a porous member segmented into at least two sucking areas;

wherein the semiconductor wafer has a sealing resin formed on the first surface, and a low dielectric constant insulation film formed in contact with the sealing resin;

the PSA tape is adhesively bonded onto the first surface of the semiconductor wafer via the sealing resin and the low dielectric constant insulation film; and the method further comprises fusing at least part of the low dielectric constant insulation film and the sealing resin so as to fix the low dielectric constant insulation film on the sealing resin.

3. A manufacturing method of a semiconductor device, comprising:

providing a groove having a thickness equal to or larger than a finishing thickness on a first surface of a semiconductor wafer on which a semiconductor element is formed;

affixing a pressure sensitive adhesive (PSA) tape onto the first surface of the semiconductor wafer in which the groove is formed;

reducing the thickness of the semiconductor wafer by processing a second surface opposite to the first surface of the semiconductor wafer onto which the PSA tape is affixed, so as to separate the semiconductor wafer into a plurality of semiconductor chips on which the semiconductor element is formed;

affixing an adhesive layer onto an entire rear surface of the separated semiconductor wafer;

peeling off the PSA tape from the semiconductor wafer while fixing the semiconductor wafer, to which the adhesive layer is affixed, under suction by use of a porous member segmented into at least two sucking areas; and cutting the adhesive layer affixed onto the entire second surface so as to separate the adhesive layer for each of the semiconductor chips, while fixing the semiconductor wafer, from which the PSA tape has been peeled off, onto the porous member under suction;

wherein peeling off the PSA tape includes:

fixing the semiconductor wafer onto the porous member by sucking the semiconductor wafer with at least two systems of suction paths in association with the sucking areas in the direction in which the PSA tape is peeled off; and when the PSA tape is peeled off along the peeling direction and part of the PSA tape is peeled off in one of the sucking areas adjacent to each other, switching the suction paths therebetween in the vicinity of the other adjacent sucking area which the peeling of the PSA tape approaches so as to suck the semiconductor wafer, thereby fixing the semiconductor wafer onto the porous member in the other sucking area, the adhesive layer is cut in parallel with a control for switch between the at least two or more systems of suction paths in response to the state in which the adhesive layer is cut.

4. A manufacturing method of a semiconductor device, comprising:

providing a groove having a thickness equal to or larger than a finishing thickness on a first surface of a semiconductor wafer on which a semiconductor element is formed;

affixing a pressure sensitive adhesive (PSA) tape onto the first surface of the semiconductor wafer in which the groove is formed;

reducing the thickness of the semiconductor wafer by processing a second surface opposite to the first surface of the semiconductor wafer onto which the PSA tape is affixed, so as to separate the semiconductor wafer into a plurality of semiconductor chips on which the semiconductor element is formed;

affixing an adhesive layer onto an entire rear surface of the separated semiconductor wafer;

peeling off the PSA tape from the semiconductor wafer while fixing the semiconductor wafer, to which the adhesive layer is affixed, under suction by use of a porous member segmented into at least two sucking areas; and cutting the adhesive layer affixed onto the entire second surface so as to separate the adhesive layer for each of the semiconductor chips, while fixing the semiconductor wafer, from which the PSA tape has been peeled off, onto the porous member under suction;

wherein the semiconductor wafer has a sealing resin formed on the first surface, and a low dielectric constant insulation film formed in contact with the sealing resin;

the PSA tape is adhesively bonded onto the first surface of the semiconductor wafer via the sealing resin and the low dielectric constant insulation film; and the method further comprises fusing at least part of the low dielectric constant insulation film and the sealing resin so as to fix the low dielectric constant insulation film on the sealing resin.

* * * * *